United States Patent [19]

Evans et al.

[11] Patent Number: 4,975,638
[45] Date of Patent: Dec. 4, 1990

[54] TEST PROBE ASSEMBLY FOR TESTING INTEGRATED CIRCUIT DEVICES

[75] Inventors: Arthur Evans, Brookfield Center; Joseph R. Baker, New Milford; Robert P. Rising, Trumbull, all of Conn.

[73] Assignee: Wentworth Laboratories, Brookfield, Conn.

[21] Appl. No.: 452,050

[22] Filed: Dec. 18, 1989

[51] Int. Cl.[5] .................. G01R 1/06; G01R 31/02
[52] U.S. Cl. ...................... 324/158 P; 324/72.5; 324/158 F
[58] Field of Search ............ 324/158 P, 158 F, 72.5, 324/73.1

[56] References Cited

U.S. PATENT DOCUMENTS

| 4,891,585 | 1/1990 | Janko et al. | 324/72.5 |
| 4,912,399 | 3/1990 | Greub et al. | 324/72.5 |

FOREIGN PATENT DOCUMENTS

| 0259163 | 3/1988 | European Pat. Off. | 324/158 P |
| 0304868 | 3/1989 | European Pat. Off. | 324/158 P |
| 0260861 | 12/1985 | Japan | 324/158 P |
| 0286243 | 12/1987 | Japan | 324/158 P |

Primary Examiner—Ernest F. Karlsen
Attorney, Agent, or Firm—Michael Ebert

[57] ABSTRACT

A test probe assembly for testing an integrated circuit (IC) device having contact pads deployed in a predetermined pattern in a common plane. The assembly includes a contactor formed by a flexible film of dielectric material having a rectangular planar central zone from whose corners extend radial slots to define suspension quadrants. Probe contacts formed on the undersurface of the central zone in a matching pattern are connected to probe terminals on the margins of the quadrants. The quadrants are marginally supported on corresponding branches of a mounting frame whereby the central zone sags below the frame which surrounds a central port in a printed circuit board, the port exposing the central zone to the IC device to be tested.

12 Claims, 4 Drawing Sheets

TEST PROBE ASSEMBLY FOR TESTING INTEGRATED CIRCUIT DEVICES

BACKGROUND OF INVENTION

1. Field of Invention:

This invention relates generally to test probe assemblies for testing integrated circuit (IC) devices whose contact pads are deployed in a predetermined pattern in a common plane, and more particularly to an assembly of this type which includes a contactor formed of flexible film material having probe contacts formed on the undersurface thereof in a matching pattern, whereby when the IC device is caused to rise so that its contact pads engage the probe contacts, this action causes the probe contacts to scrub the contact pads to ensure effective electrical contact therewith.

2. Status of Prior Art:

Many circuits and complex multi-stage electronic systems previously regarded as economically unfeasible and impractical are now realizable in integrated circuit (IC) form. The fabrication of a single-crystal monolithic circuit involves the formation of diodes, transistors, resistors and capacitors on a single microelectronic substrate formed on a silicon wafer. The circuits are applied to the wafer by photolithography, each wafer containing an array of identical integrated sections. The wafer is then sliced into "dice," so that each die or chip carries a single integrated circuit.

In a typical IC chip, input and output terminals, power supply and other circuit terminals are created by metallized contact pads, usually deployed along the margins of the chip. The geometry of the chip is either square or rectangular, and the marginal locations of the contact pads thereon depend on the circuit configuration and the available marginal space.

In order to ensure that the various circuits in each IC chip are functioning properly, so that the chip will operate reliably in the electronic apparatus in which it is included, it is necessary to test the chip before it is installed. The packaging of an IC chip is relatively costly and time consuming, and because a significant number of IC chips fail the test and have to be discarded, it is also desirable that each chip be tested before being placed in its package.

An unpackaged IC chip which has no pins or leads can be electrically connected to IC chip testing instrumentation by means of a test probe card. One well known form of a test probe card is disclosed in the Evans U.S. Pat. No. 4,382,228. The card includes an opening providing access to the IC chip being tested, the opening being surrounded by a ring of spaced conductive platforms on which are anchored blade-like needle holders each having a deflectable needle extending therefrom to engage a respective contact pad on the IC chip being tested.

In a later Evans U.S. Pat. No. 4,719,417, the test probe card is provided with double-bent needles such that when the IC chip to be tested is raised upwardly to cause its contact pads to engage the tips of the needles, further upward movement of the chip gives rise to a lateral displacement of the tips along the surfaces of the contact pads. This displacement results in a scrubbing action which serves to remove any oxide film formed on the pads that would otherwise interfere with effective electrical contact.

As pointed out in the Evans U.S. Pat. No. 4,719,417, since all of the contact pads on the IC chip lie in a common plane and must be simultaneously engaged in order to carry out testing, it is essential that all needle tips or points lie in a plane parallel to the common plane of the IC chip. Consequently, a fundamental requirement of a needle type probe card is planarization of the needle points. The nature of conventional probe cards and the character of the assembly fixtures for setting up the probe positions for such cards are such that it is difficult to assemble probes with needle points lying exactly in the same plane.

Hence a test probe card for an IC device must have contact probes capable of carrying out a scrubbing action to remove oxide film from the contact pads of the device, and the contact probes must also lie in a common plane so that they all simultaneously engage the contact pads with the same degree of pressure. While these requirements are satisfied with a test probe card of the type shown in the Evans U. S. Pat. No. 4,719,417 in which the probes take the form of double-bent needles, a card of this type does not meet a requirement often encountered in IC chips now being produced which have a multitude of contact pads. With a high density of contact pads, it is as a practical matter impossible to crowd a corresponding number of needles on the test probe card without the needles touching each other, thereby rendering the card defective.

In order to provide a test probe card for IC chips having a high density of contact pads, the patent to Grangroth et al., U. S. Pat. No. 4,649,339, makes use of a flexible dielectric film having a sheet of copper laminated thereto that is etched to define conductive leads which terminate in probe contacts. These are patterned to mate with the contact pads of high density VLSI or other integrated circuits. To bring about engagement between the probe contacts on the flexible sheet and the contact pads on the IC chip, the flexible film is arranged as a diaphragm to cover an air chamber. When pressurized air is supplied to this chamber, the film is then flexed outwardly to conform to the surface of the IC chip.

The practical difficulty with this arrangement is that the bulging film fails to ensure planarization of the probe contacts thereon when they engage the IC contact pads. The absence of such planarization inhibits proper testing of the IC device.

A similar test probe arrangement suffering from the same disadvantage is disclosed in the Brown patent, U.S. Pat. No. 4,820,976, in which gas is supplied to a pressure chamber covered by a flexible film having probe contacts thereon which when the film is subjected to pneumatic pressure bulges outwardly to cause the probe contacts to engage the contact pads on an IC chip.

The Rath patent, U.S. Pat. No. 4,758,785, discloses a motorized lift system for raising an integrated circuit device upwardly against the probe contacts on a flexible film, above which is a resilient pressure pad of silicone rubber. The practical difficulty with this arrangement is that the rubber pressure pad does not ensure planarization of the probe contacts, and without such planarization, proper testing cannot be effected.

It must be borne in mind that an IC wafer whose contact pads lie in a common plane, when raised by a lifting mechanism toward a probe test card in which the probe contacts are formed on a flexible film may be caused to assume a slight angle relative to the plane of the film. As a consequence, the contact pressure between the probe contacts and the contact pads will not be uniform, and this may militate against effective testing of the device.

SUMMARY OF THE INVENTION

In view of the foregoing, the main object of this invention is to provide a high density test probe card capable of accurately testing an IC device having a multiplicity of contact pads deployed in a common plane.

More particularly, an object of this invention is to provide a test probe card of the above-noted type which includes a flexible, thin film contactor which is subjected to pressure by a rigid pressure block having two degrees of freedom that permit the block to orient itself parallel to the plane of the IC device being tested and impose an evenly controlled force on the probe contacts carried by the contactor as well as to effect a predetermined lateral movement of the probe contacts for scrubbing the contact pads engaged thereby.

A significant advantage of the invention is that the probe contacts carried by the flexible film contactor of the test probe card all lie in a common plane and are maintained in this plane in the course of a testing procedure.

Also an object of this invention is to provide a test probe card which operates accurately and efficiently and which can be easily maintained, for the flexible film contactor can be replaced without difficulty.

Briefly stated, these objects are attained in a test probe assembly for testing an integrated circuit (IC) device having contact pads deployed in a predetermined pattern in a common plane. The assembly includes a contactor formed by a flexible film of dielectric material having a rectangular radial slits to define suspension quadrants. Probe contacts formed on the undersurface of the central zone in a matching pattern are connected to probe terminals on the margins of the quadrants. The quadrants are marginally supported on corresponding branches of a mounting frame whereby the central zone protrudes below the frame which surrounds a central port in a printed circuit board, the port exposing the central zone to the IC device to be tested.

The frame is secured to the board so that the probe terminals on the quadrants engages traces on the board leading to test terminals connectable to IC test instrumentation. A spring member cantilevered from one branch of the frame engages a pivot on a pressure block to urge the block against the upper surface of the central zone of the contactor. The block is free to rotate on the spring member and to tilt relative to its pivot whereby when the IC device is caused to rise to engage the contactor zone, the block then orients itself into parallel alignment with the plane of the device. And as the block is pushed upwardly by the rising IC device against the force of the spring member, the member then swings in an arc, causing the block to undergo lateral displacement, as a result of which the probe contacts on the zone which are pressed against the contact pads of the device scrub these pads to ensure effective electrical contact therewith.

BRIEF DESCRIPTION OF DRAWINGS

For a better understanding of the invention as well as other objects and further features thereof, reference is made to the following detailed description to be read in conjunction with the accompanying drawings, wherein.

DESCRIPTION OF INVENTION

Figure 1:
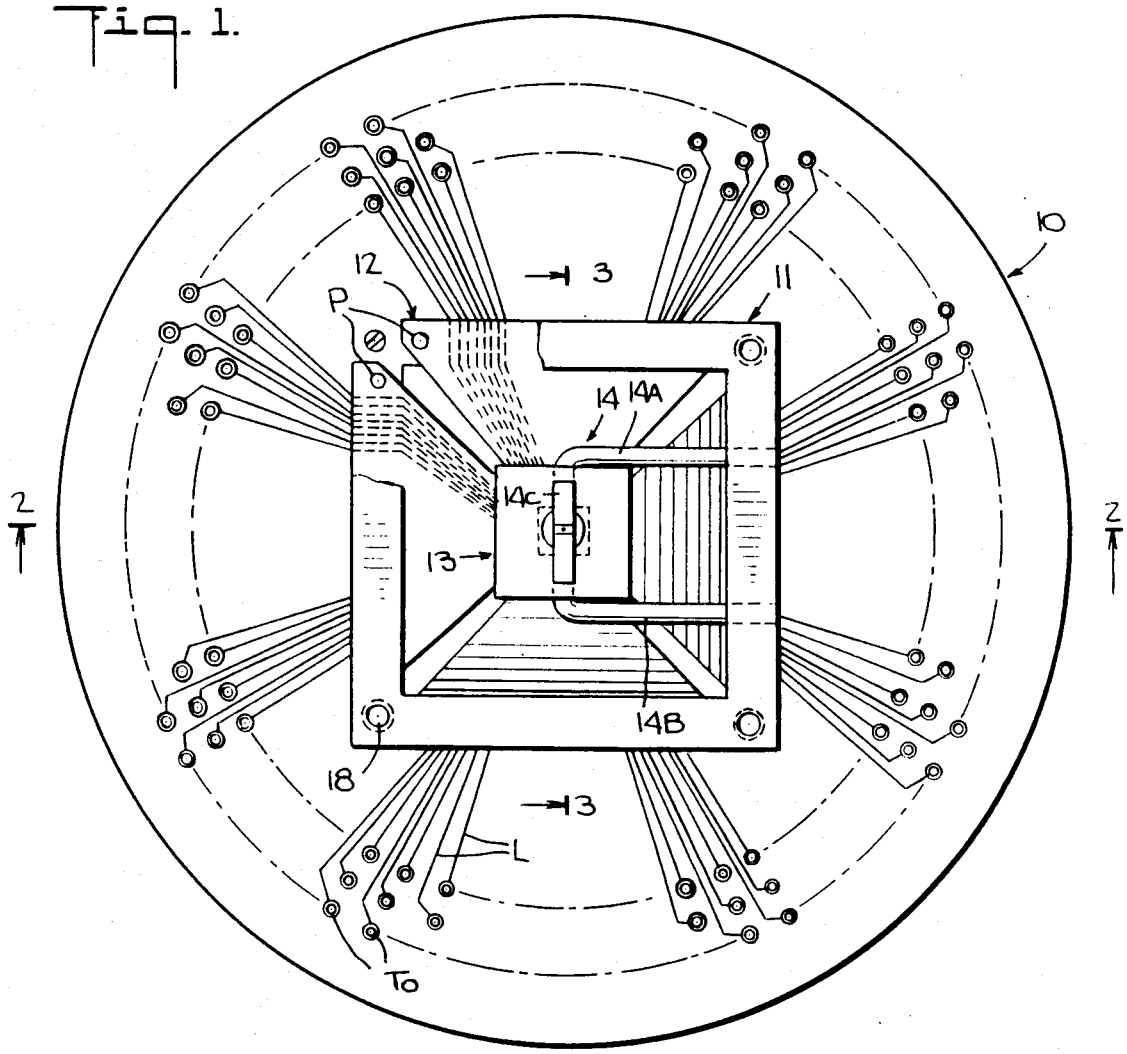
FIG. 1 is a plan view of a test probe card assembly in accordance with the invention.
Figure 2:
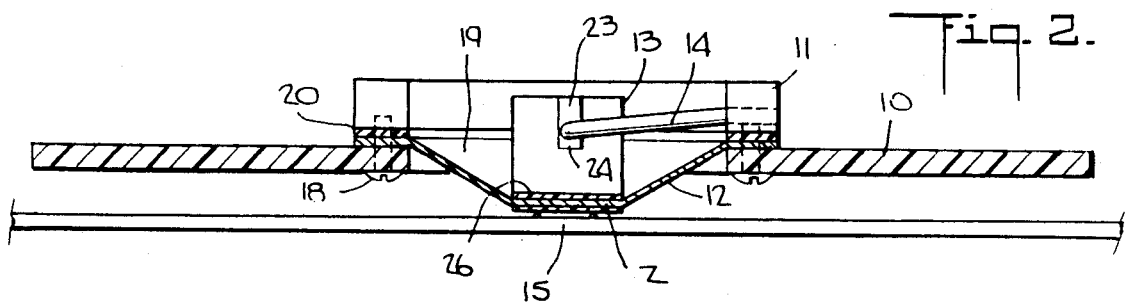
FIG. 2 is a section taken in the plane indicated by line 2—2 in FIG. 1.
Figure 3:
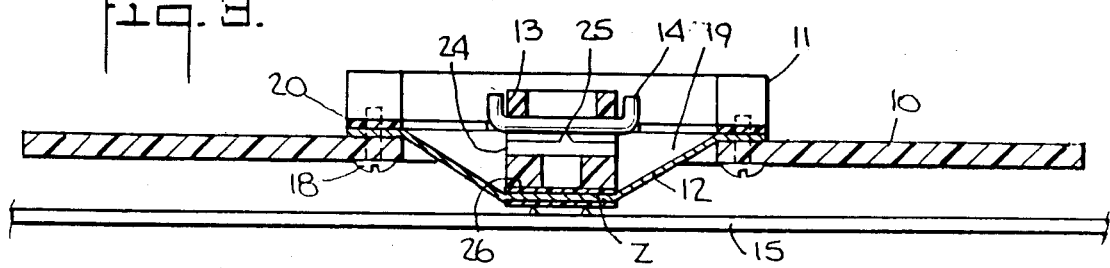
FIG. 3 is a section taken in the plane indicated by line 3—3 in FIG. 1.

Referring now to FIGS. 1 to 3, a test probe card assembly in accordance with the invention comprises the following principal components: (1) a printed circuit board 10, (2) a mounting frame 11 secured to the board, (3) a flexible film contactor 12 suspended from the frame, and (4) a rigid pressure block 13 which is urged against the contactor by (5) a spring member 14 cantilevered from one branch of the frame.

An integrated circuit device to be tested is raised upwardly by a suitable hydraulic or other form of lifting mechanism (not shown) of the type commonly used in conjunction with test probe cards to cause the contact pads deployed in a predetermined pattern in a common plane on the IC device to engage probe contacts deployed in a matching pattern on the underside of contactor 12.

Pressure block 13 is provided with a cross bar 24 having a raised pivot 25 at its midpoint which is engaged by spring member 14 so that the spring-biased block is both rotatable about the spring member and tiltable about the pivot, and therefore has two degrees of freedom. The arrangement is such that when the IC device is elevated to engage the contactor which is pressed down by the block, the block then orients itself into parallel alignment with the plane of the device. And as the block is pushed upwardly by the rising IC device against the force of the spring member, this member then swings in an arc. As a consequence, the block undergoes lateral displacement as it moves upwardly, thereby causing the probe contacts in engagement with the contact pads to scrub these pads to ensure effective electrical contact therewith.

Figure 4:
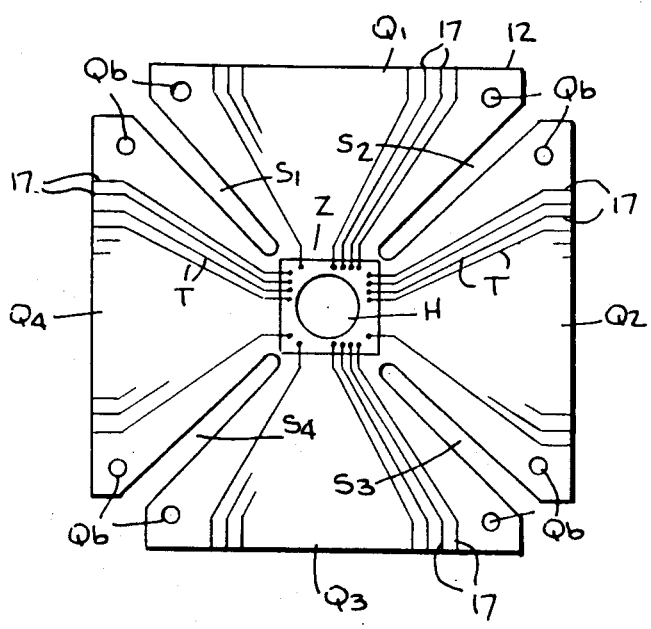
FIG. 4 separately shows in plan view the contactor included in the assembly, the contactor being shown in its flat state.
Figure 5:
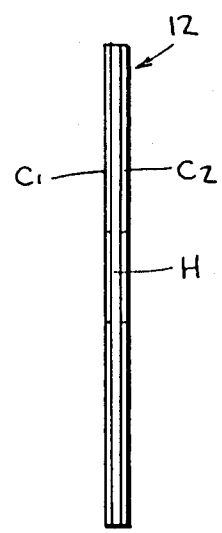
FIG. 5 is a section taken through the midpoint of the contactor.
Figure 6:
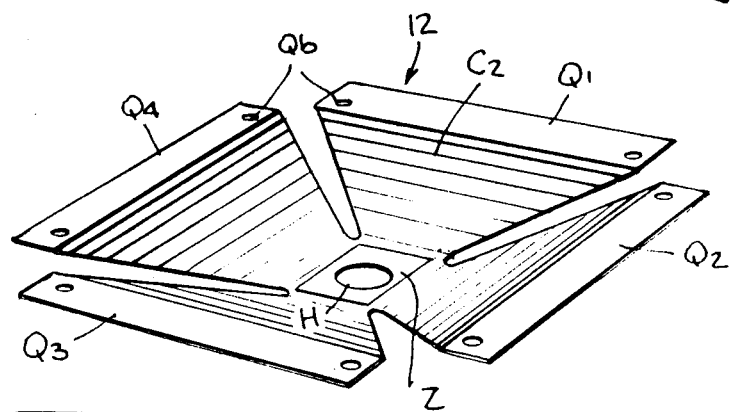
FIG. 6 is a perspective view of the contactor.

As shown separately in FIGS. 4, 5 and 6, contactor 12 is fabricated of a thin film of flexible dielectric material such as a 0.00025 to 0.003 thick polyimide film, or a film of a flexible, synthetic plastic material having similar dielectric and structural properties. Laminated to opposing faces of the film are thin, flexible copper layers $C_1$ and $C_2$, the outer layer $C_2$ functioning as a ground plane. The inner layer, which is on the underside of the contactor, is finely etched to define conductive copper traces or leads T. In practice, conductive flexible metals other than copper may be used.

Contactor 12, which is formed of a rectangular sheet of film material, is provided with a rectangular central zone Z having a center hole H. Extending from the corners of zone Z are radial slots $S_1$ to $S_4$ that define four suspension quadrants $Q_1$, $Q_2$, $Q_3$ and $Q_4$. Plated on zone Z are minute bumps forming probe contacts 16 in a pattern that matches the pattern of the contact pads on the IC chip to be tested. Probe contacts 16 form hard and durable contact points capable of penetrating oxides on the IC contact pads. They are connected by conductive traces T created by etching copper layer $C_1$ to probe terminals 17 formed on the margins of quadrants $Q_1$ to $Q_4$. These conductive traces T on the quadrants fold flat around the bottom of pressure block 13 which is urged against the upper surface of zone Z of the contactor. In practice, the probe contact bumps plated on the undersurface of zone Z are 0.00025 to 0.003 above copper leads or traces T.

Figure 7:
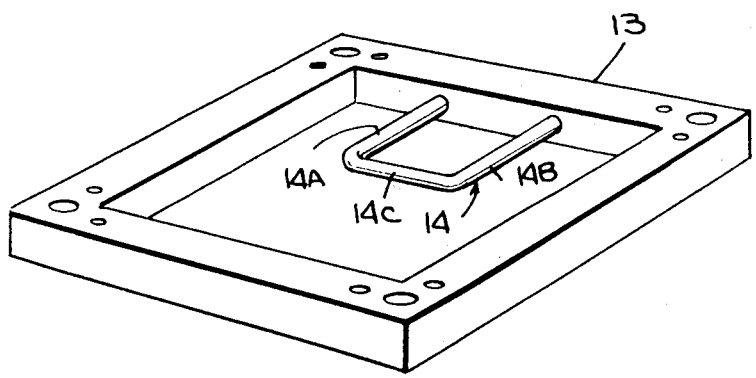
FIG. 7 shows, in perspective, the mounting frame of the assembly.

Quadrants $Q_1$ to $Q_4$ are marginally supported on the underside of the corresponding branches of square metal mounting frame 11 by means of pins P which go through bores $Q_b$ drilled in the corners of each quadrant. The pins are received in bores at the corners of the frame, as shown in FIG. 7. Frame 11 is secured at its corners by screws 18 to printed circuit board 10, the frame surrounding a port 19 in the board which exposes zone Z of the contactor to the IC device 15 to be tested.

Figure 9:
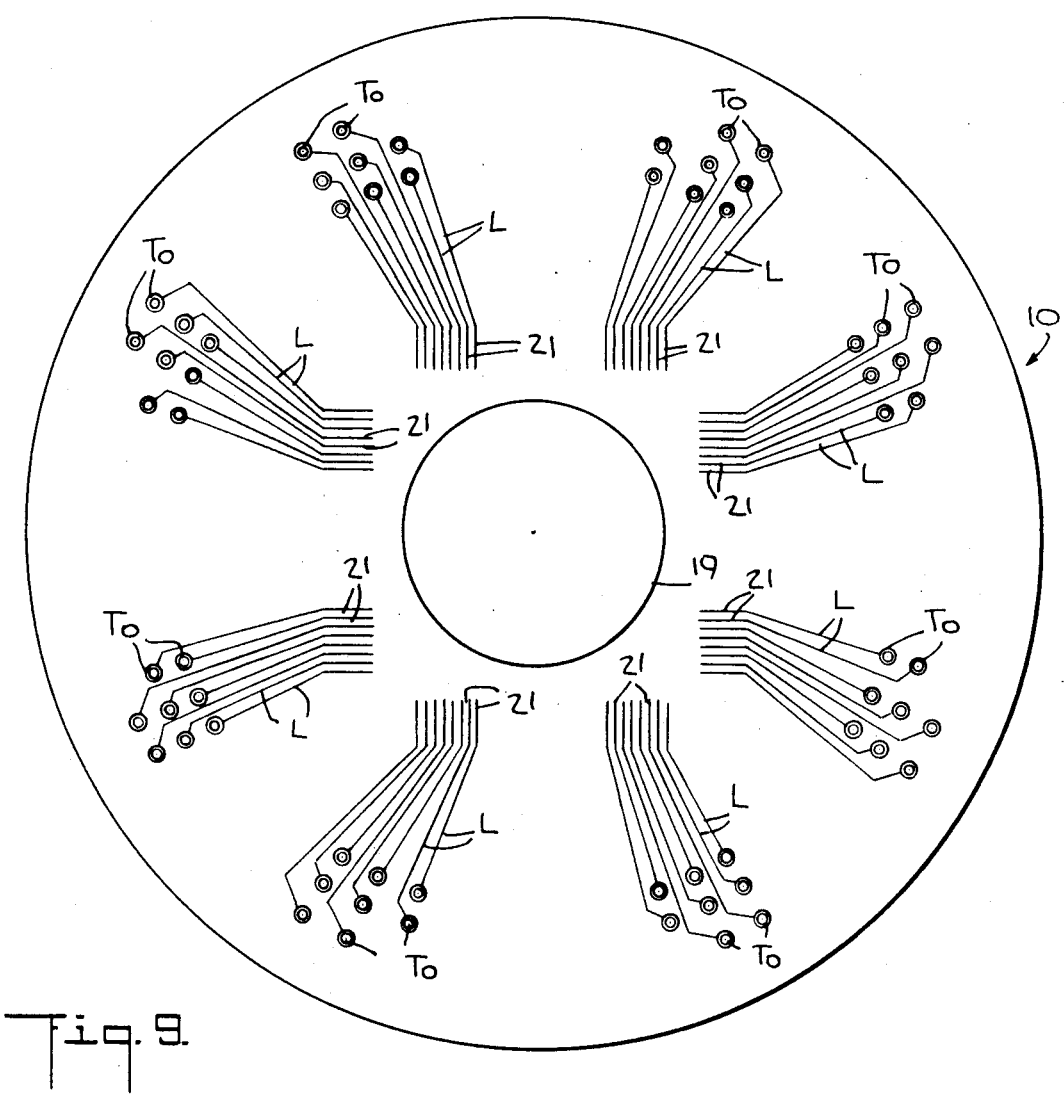
FIG. 9 is a plan view of the printed circuit card included in the assembly.

Interposed between each branch of frame 11 and the corresponding margin of a quadrant on contactor 12 pinned to this branch is an insulating pad 20 of resilient material. As shown in FIG. 9, printed circuit board 10 is provided with conductive leads or traces L that run from input terminals 21 surrounding port 19 and test terminal $T_0$ which are connectable to the test head instrumentation for conducting tests on the integrated circuit.

When the frame supporting contactor 12 is mounted on the printed circuit board, then the board input terminals 21 are in contact with the corresponding probe terminals 17 on the margins of quadrants $Q_1$ to $Q_4$ of contactor 12. Thus when the test probe is fully assembled, each probe contact 16 on zone Z of the contactor is connected to a respective test terminal $T_0$ on card 10.

In practice, leads L may be formed of resistive material to introduce ohmic values in each contact probe path to provide a desired impedance termination. Resistive connections may also be formed between signals and ground leads for impedance termination.

Figure 8:
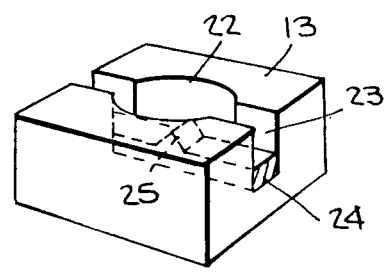
FIG. 8 shows in perspective the pressure block of the assembly.

Spring 14 is U-shaped, the side arms 14A and 14B thereof having its ends embedded in the right side branch of frame 11, whereby the spring is cantilevered from the frame. Pressure block 13, which is preferably formed of transparent synthetic plastic material, such as acrylic or polycarbonate material, is provided, as shown in FIG. 8, with a center hole 22 and a slot 23 that passes through the diameter of the hole. Received in slot 23 is a metal cross bar 24 having a raised pivot 25 at its midpoint which lies on the center axis of hole 22.

The cross arm 14C of spring member 14 is received in slot 23 of the pressure block and rests on pivot 25. The block is free to rotate about the cross arm, and the block is also tiltable about the pivot so that it has two degrees of freedom.

Spring member 14 is preferably designed to apply approximately one gram of force per 0.001 in vertical travel of the pressure block per each probe contact. Pressure block 13 is urged by spring member 14 against the upper surface of zone Z of the contactor. Interposed between the pressure block and zone Z is a thin elastomeric pad 26 of approximately 5 mils thick which serves to relieve the pressure from local variation of probe height.

Figure 10:
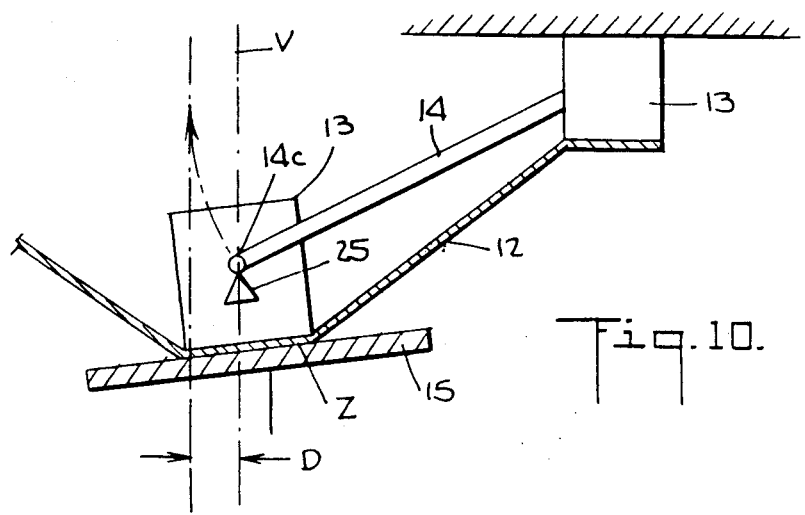
FIG. 10 schematically illustrates the two degrees freedom of movement which permit the pressure block to align itself with the plane of the wafer being tested and to then shift laterally to effect a scrubbing action.

As shown schematically in FIG. 10, pressure block 13 which is pressed down by spring member 14 on the upper surface of zone Z of contactor 12 has two distinct degrees of freedom. First, it is rotatable about the axis of the cross arm 14C (see FIG. 7) of the spring member. Second, it is also tiltable with respect to the midpoint pivot 25 on the cross piece 24 received in slot 23 in the block.

Hence when IC device 15 is raised upwardly so that its contact pads engage the probe contacts on the underside of zone Z of contactor 12 and an upward pressure is applied to spring-biased pressure block 13, the block should its undersurface not be exactly parallel to the plane of the IC device, will then orient itself into parallel alignment with this plane. As a result of this self-planarization feature, an evenly controlled force is imposed on the probe contacts. This is shown schematically in FIG. 10 in which the deviation of device 15 from the horizontal plane is exaggerated.

And as IC device 15 continues to rise vertically along vertical axis V against the force of spring member 14, spring member 14 is then caused to swing upwardly in an arc, and in doing so to displace block 13 engaged thereby laterally by a distance D, this distance being exaggerated.

As a consequence of this lateral displacement, the probe contacts on the underside of zone Z of the contactor are caused to scrub the engaged contact pads of the IC device, and in doing so to displace any oxide film therefrom and thereby ensure effective electrical contact between the probe contacts and the contact pads.

In one practical embodiment, the angle of spring member 14 is set at 6 degrees below the horizontal plane of the frame from which it is cantilevered to produce a 10 percent side component of scrub on the pressure block and on the probe contacts in the contactor zone below the block. This zone, which is clamped between the IC device and the pressure block, is suspended from the flexible quadrants of the contactor and is therefore free to shift laterally.

The central hole H in contactor zone Z and hole 22 in pressure block 13 in registration therewith afford a passage for an inking pen to mark the device under test to indicate whether or not it has passed the test. In practice, edge sensors may be built into the corners of the block to indicate the state of the block relative to the device under test. The pressure block as well as the contactor film are preferably transparent so that one may visually observe the state of contact alignment through a microscope.

Figure 11:
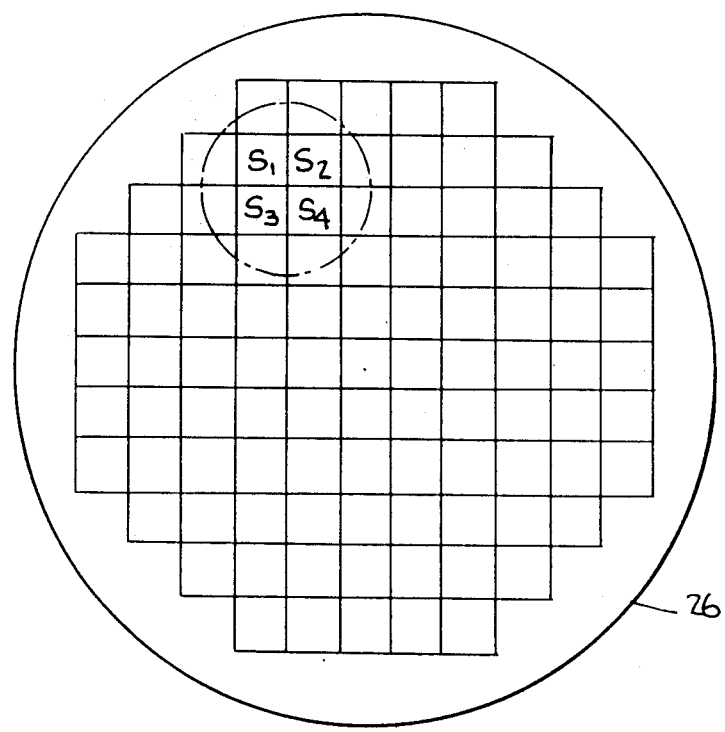
FIG. 11 is a plan view of an IC wafer having an array of IC sections thereon.

A test probe assembly in accordance with the invention is not limited to testing single IC chips or dies, but may be used to test in a single operation a set of such dies. Thus semiconductor wafer 26 shown in FIG. 11 has formed thereon an array of integrated circuit sections including a set of contiguous IC sections $S_1$, $S_2$, $S_3$ and S4. When the wafer is cut, the sections then become individual chips or dies.

Figure 12:
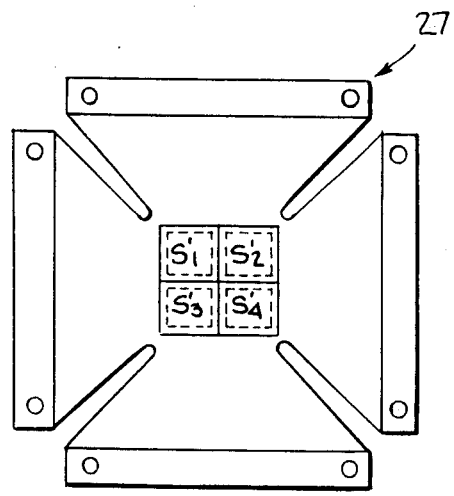
FIG. 12 is a plan view of a contactor in accordance with another embodiment of the invention whose central zone is provided with a set of four probe contact sections to engage the contact pads on corresponding IC sections on the wafer shown in FIG. 11.

Before the wafer is sectioned, it is possible to test in a single operation the set composed of IC sections S1 to S4 by means of a test probe assembly whose contactor 27, as shown in FIG. 12, has a central zone on whose underside is formed a set of four probe contact sections S'1, S'2, S'3 and S'4, the pattern of probe contacts in each section matching the pattern of contact pads in the IC sections. This is by way of example only, and in practice contactor 27 may be designed to test a larger number of IC sections.

The contactor may be fabricated using lithographic techniques. In practice, the contactor may be formed of interlaminated plies of flexible plastic film, each carrying conductive leads. This multi-layer arrangement may be necessary when a very large number of probe contacts are required.

Because the contactor is pinned to the mounting frame screwed into the printed circuit board, disassembly thereof is not difficult, and one may, when necessary, replace the contactor.

The invention makes it possible to provide a matched impedance environment. Each probe contact 16 on the undersurface of the film of dielectric material is connected by a conductive trace T to a test head; that is to external electronic instrumentation for conducting tests on the IC device whose contact pads are engaged by probe contacts 16. The test head has a known impedance and is it is advantageous therefore that this impedance be matched by the impedance formed between the trace T on the undersurface of the dielectric film and the ground plane formed by the conductive layer on the upper surface of the film.

For a given dielectric film such as polyimide having a given thickness, the impedance is a function of the width of conductive trace T. Hence to effect an impedance match, an appropriate trace width is provided.

The ability to provide a matched impedance environment greatly enhances the testing of the integrated circuit device being contacted and represents a major advance over prior art probe cards which use tungsten needles to contact the contact pads of the IC device. A tungsten needle cannot provide a matched impedance, as a consequence of which high-frequency test signals are radiated from and degrade over the unprotected length of the needle.

While there has been shown and described a preferred embodiment of a test probe assembly for testing integrated circuit devices in accordance with the invention, it will be appreciated that many changes and modifications may be made therein without, however, departing from the essential spirit thereof.

We claim:

1. A test probe assembly for testing an integrated circuit device whose contact pads are deployed in a predetermined pattern in a common plane, said assembly comprising:

(a) a contactor fabricated from a flexible film of dielectric material having a planar central zone from whose corners extend radial slots to define four suspension quadrants, probe contacts being formed on the undersurface of the zone in a pattern matching that of the contact pads, said contacts being connected by conductive traces to probe terminals on the margins of the quadrants;

(b) a mounting frame for supporting the contactor, said frame having four branches to whose undersides are secured the margins of respective quadrants whereby the central zone suspended from the quadrants protrudes below the frame;

(c) a printed circuit board having an opening therein and input terminals surrounding the opening connected by leads to test terminals connectable to electronic instrumentation for conducting tests on the device, said frame being secured to said board at a position in which the central zone of the contactor supported by the frame lies below the opening and the probe terminals on the contactor engage the input terminals on the board whereby each contact probe is then connected to a respective test terminal; and (d) a spring-biased pressure block positioned within the frame and urged against the upper surface of the contactor zone whereby when the device to be tested is raised so that its contact pads engage the probe contacts of the contactor zone, pressure is applied thereto by the block, said block being tiltable relative to the frame whereby when the device rises to cause its contact pads to engage the probe contacts, the block then orients itself into parallel alignment with the plane of the device to impose an evenly controlled pressure on the probe contacts.

2. A test probe assembly as set forth in claim 1, wherein said film is provided with a thin,,flexible metal layer on its undersurface which is etched to define said traces from the probe contacts.

3. A test probe assembly as set forth in claim 2, wherein said probe contacts are electroplated on the undersurface of the zone.

4. A test probe assembly as set forth in claim 1, wherein said pressure block is spring-biased by a spring member cantilevered from one branch of the frame, which member engages a pivot on the pressure block, the block being rotatable on the member and being free to tilt relative to its pivot, whereby when the device rises to engage the contactor zone, the block then orients itself into parallel alignment with the plane of the device.

5. A test probe assembly as set forth in claim 4, wherein said spring member is a U-shaped spring whose side arms are embedded at their ends in said one branch and whose cross arm engages the pivot whereby as the block is pushed upwardly by the rising device against the force of the spring member, the member then swings in an arc, causing the block to undergo lateral displacement as a result of which the probe contacts in the zone scrub the contact pads in the device.

6. A test probe assembly as set forth in claim 5, wherein said block is provided with a slot to receive a cross piece having said pivot at its midpoint.

7. A test probe assembly as set forth in claim 1, wherein said film is a polyamide film.

8. A test probe assembly as set forth in claim 1, further including a pad of resilient material interposed between each branch of the frame and the board.

9. A test probe assembly as set forth in claim 1, wherein said block has a center hole therein, and said zone has a center hole therein in registration with the block hole to admit a marking pen.

10. A test probe assembly as set forth in claim 1, wherein said dielectric film is provided with thin, flexible metal layers on opposite faces thereof, the undersurface layer being etched to define said traces from the probe contacts, the upper surface layer forming a ground plane.

11. A test probe assembly as set forth in claim 8, wherein each trace has a width that results in an impedance which is formed by the trace, the dielectric film and the ground plane that substantially matches the impedance of the instrumentation connected to the trace.

12. In a test probe assembly as set forth in claim 1, wherein said device is provided with a set of integrated circuit sections, and said zone is provided with a corresponding set of sections each having probe contacts in a pattern matching the pattern of contact pads on the respective integrated circuit section.

* * * * *